(12) United States Patent
Abbott

(10) Patent No.: US 7,029,963 B2
(45) Date of Patent: Apr. 18, 2006

(54) SEMICONDUCTOR DAMASCENE TRENCH AND METHODS THEREOF

(75) Inventor: Todd R. Abbott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,078

(22) Filed: Aug. 30, 2001

(65) Prior Publication Data

US 2003/0042546 A1   Mar. 6, 2003

(51) Int. Cl.
H01L 29/80   (2006.01)

(52) U.S. Cl. ........................ 438/197; 438/586

(58) Field of Classification Search ............... 438/259, 438/589, 586, 618, 289, 197, 299, 306
See application file for complete search history.

(56) References Cited

U.S. PATENT DOCUMENTS 3,891,190 A * 6/1975 Vadasz ...................... 257/382
5,599,728 A * 2/1997 Hu et al. .................... 438/289
5,741,735 A 4/1998 Violette et al.
5,844,274 A * 12/1998 Tsutsumi ..................... 257/333
5,945,707 A 8/1999 Bronner et al.

(Continued)

OTHER PUBLICATIONS

Wolf, Silicon Processing for the VLSI Era, vol. 2-Process Integration, Lattice Press: Sunset Beach CA, 1990, pp. 20-22, 39-41.*
Wolf, et al. Silicon Processing for the VLSI Era, vol. 1-Process Technology, Lattice Press: Sunset Beach CA, 1986, pp. 280-282, 397-399.*

(Continued)

Primary Examiner—Tuan H. Nguyen
(74) Attorney, Agent, or Firm—Dinsmore & Shohl LLP

(57) ABSTRACT

A method is provided for forming damascene gates and local interconnects a single process. By combining the formation of a damascene gate and local interconnect into a single process, a low cost solution is provided, having the advantages of low resistance wordlines and reduced gate length while reducing or eliminating the local interconnect to gate contact resistance. Further, the present invention provides flexible layout of active area to form small memory cells based upon the damascene gate and local interconnect structure. As such, the present invention is particularly suited for the fabrication of SRAM memory devices.

3 Claims, 9 Drawing Sheets

U.S. PATENT DOCUMENTS

| | | |
|---|---|---|
| 5,963,818 A | 10/1999 | Kao et al. |
| 6,037,194 A | 3/2000 | Bronner et al. |
| 6,054,355 A | 4/2000 | Inumiya et al. |
| 6,083,827 A * | 7/2000 | Lin et al. .................... 438/631 |
| 6,103,579 A | 8/2000 | Violette |
| 6,141,239 A | 10/2000 | Manning |
| 6,172,387 B1 | 1/2001 | Thakur et al. |
| 6,174,764 B1 | 1/2001 | Manning |
| 6,194,301 B1 | 2/2001 | Radens et al. |
| 6,200,895 B1 | 3/2001 | Givens et al. |
| 6,225,170 B1 | 5/2001 | Ibok et al. |
| 6,258,679 B1 | 7/2001 | Burns et al. |
| 6,261,905 B1 * | 7/2001 | Chen et al. ................ 438/264 |
| 6,261,947 B1 | 7/2001 | McTeer |
| 6,274,409 B1 * | 8/2001 | Choi .......................... 438/128 |
| 6,287,926 B1 * | 9/2001 | Hu et al. .................... 438/306 |
| 6,351,016 B1 * | 2/2002 | Huang et al. ............... 257/382 |
| 6,534,393 B1 * | 3/2003 | Zhou et al. ................. 438/618 |
| 6,548,871 B1 * | 4/2003 | Horita et al. ............... 257/368 |
| 2004/0029331 A1 | 2/2004 | Abbott |

OTHER PUBLICATIONS

Ghandi, VLSI Fabrication Principles, 2nd ed., John Wiley & Sons: New York, 1994, pp. 452-456.*

Van Zant, Microchip Fabrication, 4th ed. McGraw-Hill: New York, 2000, p. 199.*

* cited by examiner

SEMICONDUCTOR DAMASCENE TRENCH AND METHODS THEREOF

CROSS-REFERENCE TO RELATED APPLICATIONS

This application is related to commonly assigned U.S. application Ser. No. 10/215,915 entitled CONDUCTIVE STRUCTURE FOR MICROELECTRONIC DEVICES AND METHODS OF FABRICATING SUCH STRUCTURES, filed Aug. 8, 2002.

BACKGROUND OF THE INVENTION

The present invention relates in general to the fabrication of integrated circuits, and in particular to integrated circuit structures having damascene trench gates and local interconnects formed in a single process, and methods of fabricating such integrated circuit structures.

Integrated circuit manufacturers continually strive to scale down semiconductor devices in integrated circuit chips. By scaling down semiconductor devices, greater speed and capacity can be realized while reducing power consumption of the chip. For example, in order to provide increased capacity in memory chips such as SRAM, it is highly desirable to shrink the size of each memory cell as much as possible without significantly affecting performance. This can be accomplished by shrinking the size of each component that forms each memory cell, packing the components closer together, or both.

Further, as integrated circuits are scaled down, the complexity of fabricating the components that make up the devices continues to increase. With the increase in complexity also comes an increase in the cost of fabricating the integrated circuits. For example, as memory cells in SRAM continue to shrink, undesirable variations between desired results and actual results become a limiting factor because of the inherent limitations in many processes employed in the course of manufacturing. For example, precision limits in photolithography, and deposition processes affect production parameters.

Also, every masking step that is performed during fabrication dramatically increases the cost of manufacturing a given device. For example, in a typical damascene gate structure, three or more deposition and planarizing steps are required.

Therefore, there is a continuing need for a structure, process and method of fabrication that allows consistent and reliable formation of damascene gates and interconnects using minimal manufacturing processes.

SUMMARY OF THE INVENTION

The present invention overcomes the disadvantages of previously known integrated circuit fabrication techniques by providing a structure, layout, and method thereof, that combines the formation of a damascene gate and damascene local interconnect into a single mask and process. By combining the formation of a damascene gate and local interconnect into a single process, the advantages of low resistance wordlines and reduced gate length are realized while eliminating the local interconnect to gate contact resistance. Further, the present invention provides flexible layout of active area to form small memory cells viable in a production environment. As such, the present invention is particularly suited for the fabrication of SRAM memory devices.

In accordance with one embodiment of the present invention, isolation trenches are formed in a base substrate. An ILD layer is deposited over the base substrate, then a patterning and etching process is performed to define gate/local interconnect damascene trenches. Any residual resist material is then stripped away. A layer of gate oxide is formed at least within the gate/local interconnect damascene trenches at areas where gates are to be formed. If oxide is formed on the base substrate in the contact areas that define local interconnects, a patterned oxide etch is performed to remove at least a portion of the oxide from the base substrate contact area within the gate/local interconnect damascene trenches in the areas to define local interconnects. Any desired implants are performed and any residual resist is stripped.

A conductive layer is deposited over the structure filling the damascene trenches thus defining damascene gates and local interconnects. A polishing process is then performed to polish back the conductive layer to the ILD layer. Next, the ILD layer is stripped and spacers are formed adjacent to the gates and local interconnects. After forming the spacers, any additional required doping is performed. For example, the base substrate is doped to define source and drain regions of active area. Finally, any required back end of line wiring is completed.

It is an object of the present invention to provide a semiconductor structure that requires only one deposition and CMP process in forming a gate and local interconnect.

It is an object of the present invention to provide a semiconductor structure that eliminates the local interconnect to gate contact resistances.

It is an object of the present invention to provide a small cell layout for an SRAM memory cell.

Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein only if those steps are necessary for an understanding of the present invention.

As used herein, the formation of a layer or region "over" a substrate or other layer refers to formation above, or in contact with, a surface of the substrate or layer. For example, where it is noted or recited that an insulating layer is formed over a substrate, it is contemplated that intervening structural layers may optionally be present between the insulating layer and the substrate.

FABRICATION OF A GATE AND LOCAL INTERCONNECT DAMASCENE TRENCH

Figure 1:
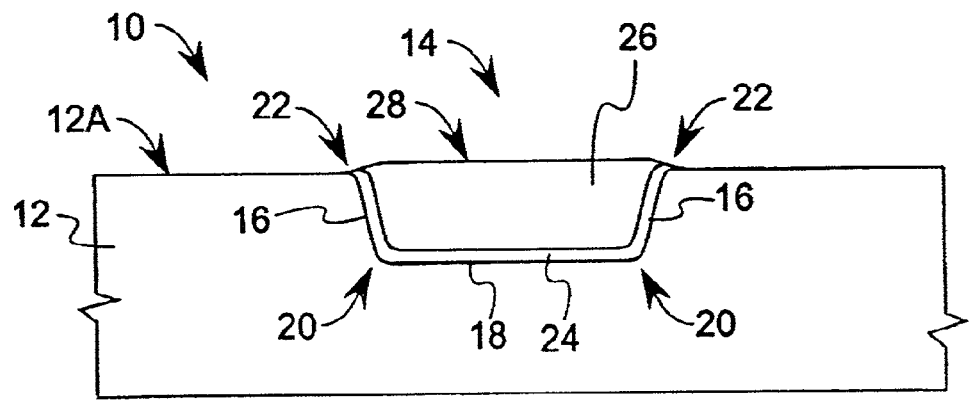
FIG. 1 is an illustration of a semiconductor base substrate having an isolation trench formed therein according to one embodiment of the present invention

As illustrated in FIG. 1, the semiconductor structure 10 comprises a base substrate 12 having an isolation trench 14 previously formed therein. The base substrate 12 is silicon or any other semiconductor material or combination of materials as is known in the art. For example, the substrate 12 can comprise gallium arsenide (GaAs) or other semiconductor materials such as InP, CdS, or CdTe. The isolation trench 14 defines an isolation region, and is formed using any available techniques including for example, shallow trench isolation (STI) methods. As illustrated, the is isolation trench 14 includes first and second sidewalls 16, a trench floor 18 generally parallel to the surface 12A of the base substrate 12, rounded lower trench corners 20 and rounded upper trench corners 22. An optional first oxide layer 24 lines the isolation trench 14, and a first dielectric material 26 fills in the isolation trench 14. It will be appreciated that the isolation trench 14 may contain additional layers or have a different geometry depending upon the isolation characteristics desired.

Ideally, the upper portion 28 of the first dielectric material 26 is planar and generally parallel to the base substrate surface 12A. However, a small convex surface in the upper portion 28 of the first dielectric material 26 may result depending upon the isolation trench formation techniques used. For example, in STI, layers of oxide and nitride are deposited over the base substrate, and a mask is patterned over the nitride to define the isolation region (not shown). After etching and filling the isolation trench with the first dielectric material, the mask, nitride, and oxide layers are stripped from the base substrate. For example, a wet etch, such as a hot phosphoric acid or other suitable etchant is employed to remove the nitride layer and first dielectric layer generally above the isolation trench. However, the nitride layer may etch faster than the first dielectric material. As such, after also removing the oxide, such as with a buffered oxide etch (BOE), the convex surface on the upper portion 28 of the first dielectric material 26 is left as illustrated in FIG. 1. Such a construction generally will not affect the present invention, however it is undesirable to form a dish or divot in the first dielectric material 26 over the isolation trench 14 due to device performance limitations.

Typically, ions are implanted in the base substrate 12 to form n-type and p-type wells. This process is preferably performed after forming the isolation trench 14, but may be performed prior thereto. The wells define the locations of the n-channel and/or p-channel devices, thus the precise implants will be application specific. For example, to form a p-well, the base substrate 12 is implanted with a p-type dopant including for example, trivalent elements such as boron. Likewise, to form an n-well, the base substrate 12 is implanted with an n-type dopant including for example, pentavalent elements such as phosphorous. Further, ion implants may be embedded into the base substrate 12 through the isolation trench opening formed in the base substrate 12 before filling the isolation trench with the dielectric material 26.

Figure 2:
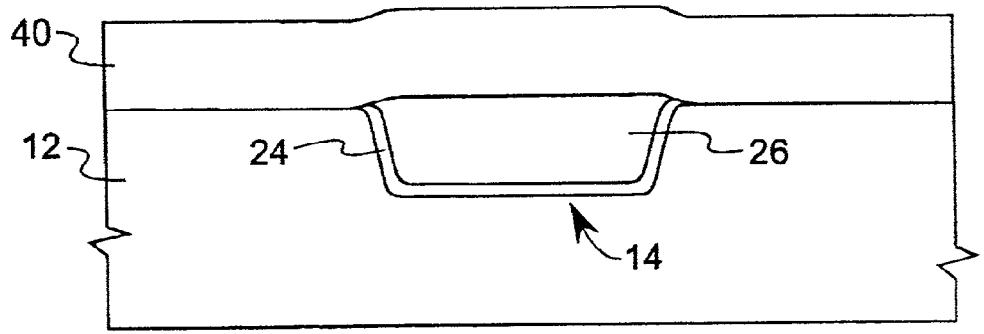
FIG. 2 is an illustration of a semiconductor structure during fabrication wherein an ILD layer is formed on the base substrate of FIG. 1 according to one embodiment of the present invention.

Referring to FIG. 2, an interlayer dielectric (ILD) layer 40 is deposited over the base substrate 12. The ILD layer 40 is shown substantially conformal, however, such is not a requirement to practice the present invention. As such, there is no need to CMP or otherwise planarized the top surface of the ILD layer 40. As used herein, a conformal layer is a layer having a generally uniform thickness that follows the contours of the underlying layers. The ILD layer 40 may be any dielectric material, the selection of which may be dependent upon subsequent processes and the intended application. Further, the thickness of the ILD layer 40 can vary depending upon the application. For example, where the ILD layer 40 forms a gate, the thickness of the ILD layer 40 affects the height of the conductive material used to form the gate as more fully described herein, and thus provides a manner to affect the electrical characteristics of the gate.

Figure 3:
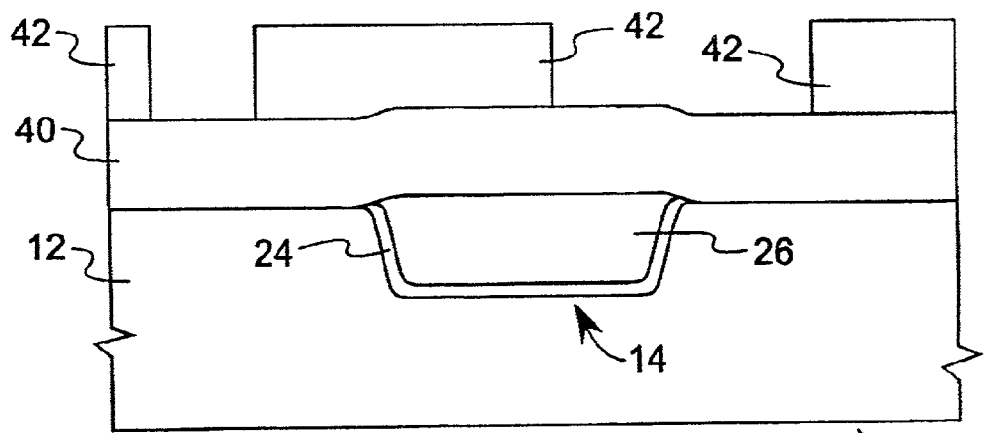
FIG. 3 is an illustration of a semiconductor structure during fabrication wherein a patterned mask is formed over the ILD layer of FIG. 2 according to one embodiment of the present invention.

Referring to FIG. 3, a second mask layer 42 is deposited over the ILD layer 40 and patterned to define the desired openings in the ILD layer 40, such as damascene gate/local interconnects, or other devices. The second mask 42 may comprise for example, a photo resist layer or other process.

Figure 4:
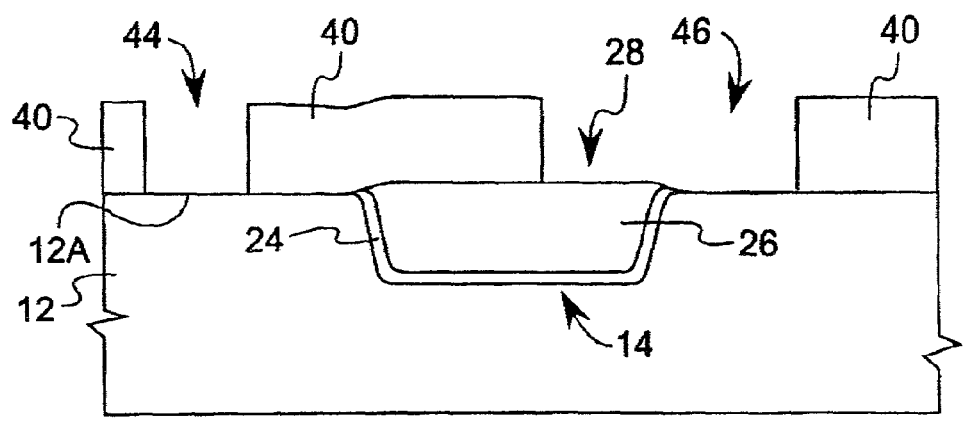
FIG. 4 is an illustration of a semiconductor structure during fabrication wherein gate/local interconnect damascene trenches are formed through the ILD layer, and the patterned mask of FIG. 3 is stripped away according to one embodiment of the present invention.

As illustrated in FIG. 4, an etching process is performed to define gate/local interconnect damascene trenches 44, 46. While only two gate/local interconnect damascene trenches 44, 46 are shown, any number of gate/local interconnect damascene trenches may be formed. Further, any combination of gates and local interconnects can be formed within each of the gate/local interconnect damascene trenches 44, 46 as explained more fully herein. It will be appreciated that the gate/local interconnect damascene trenches 44, 46 are formed in a single mask and etch operation. This reduces the cost of manufacturing integrated circuits according to the present invention. The second mask 42 (not shown in FIG. 4) is then stripped off.

For illustrative purposes, FIGS. 4–13 show the formation of both a gate and local interconnect. As will be seen, a gate is formed in the gate/local interconnect damascene trench 44 and a local interconnect is formed in the gate/local interconnect damascene trench 46.

Further, the gate/local interconnect damascene trench 46 is illustrated partially overlying a portion of the isolation trench 14. However, this is only illustrative of the possible formations according to the present invention. For example, the gate/local interconnect damascene trench 46 can be formed so as to avoid overlying a portion of the isolation trench 14.

Figure 5:
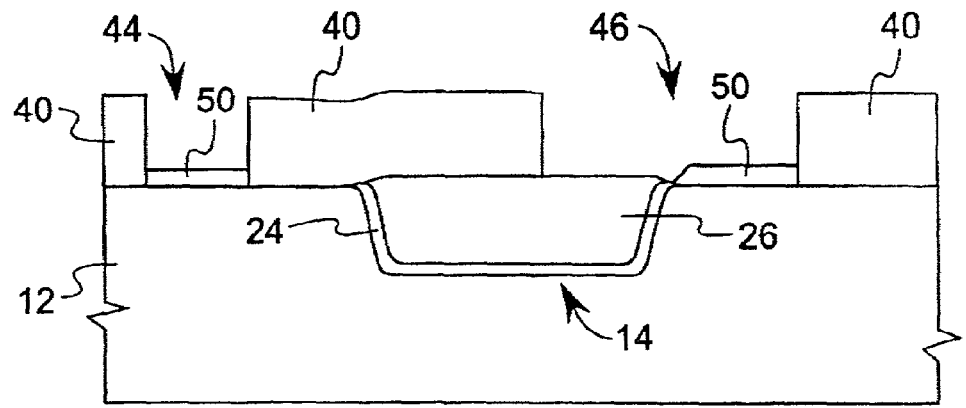
FIG. 5 is an illustration of a semiconductor structure during fabrication wherein an oxide layer is grown on the exposed silicon of the base substrate in the areas not covered by the oxide within the isolation trench or ILD layer FIG. 4 according to one embodiment of the present invention.

As illustrated in FIG. 5, a gate oxide layer 50 is grown on the base substrate 12. The gate oxide layer 50 can be grown by thermal oxidation of the base substrate 12, or by other conventional techniques such as chemical vapor deposition (CVD). It will be appreciated that when growing the gate oxide layer 50, the oxide will form on any exposed silicon surface. As such, it may be necessary to remove any undesired oxide that formed as a result of the process. As an example, oxide will grow on the base substrate 12 within the portions of the gate/local interconnect damascene trenches intended to form local connections as illustrated in the gate/local interconnect damascene trench 46.

Figure 6:
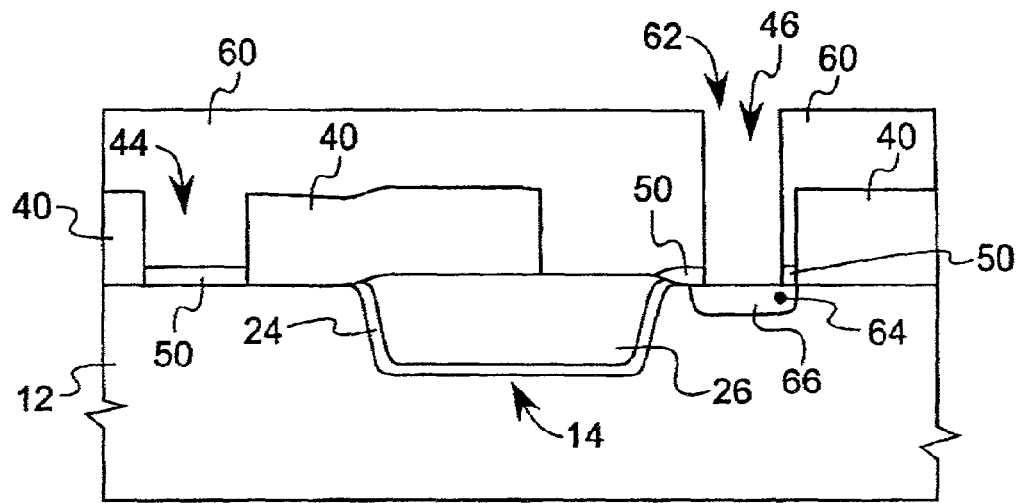
FIG. 6 is an illustration of a semiconductor structure during fabrication wherein a photoresist layer is patterned over the semiconductor structure of FIG. 5, portions of the oxide layer are removed, and implants are performed into the base substrate according to one embodiment of the present invention.

As illustrated in FIG. 6, a third mask 60 is deposited over the structure 10 and patterned to etch away undesired portions of the gate oxide layer 50 to define an active area contact or exhumed contact 62 generally within the area defining the gate/local interconnect damascene trench 46. However, oxide may be removed from portions of the gate/local interconnect damascene trench 44 if local interconnects are also formed within the trench.

Figure 7:
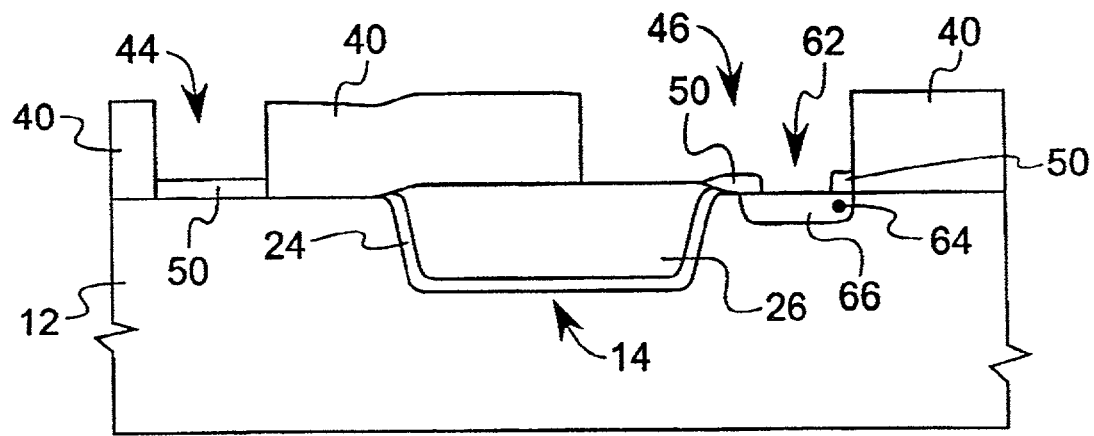
FIG. 7 is an illustration of a semiconductor structure during fabrication wherein the photoresist layer of FIG. 6 is stripped away.

Further, optional contact implants 64 are formed in the plug area 66. The contact implant 64 is provided to keep the contact from shorting to the substrate. Further, according to one embodiment of the present invention, the contact implants 64 will merge with source/drain implants for device connection. Thus contact implants may be formed in either of the gate/local interconnect damascene trenches 44, 46 where an interconnect is formed. It will be appreciated that depending upon the application, either no implant, or alternative types of implants may also be used. For example, an implant with low ion energies may be used to construct a field threshold voltage ($V_t$) implant to improve electrical isolation between active areas separated by isolation trench and isolation regions because the implant results in a reduced doping profile, and thus reduced electrical field and reduced leakage. Other types of implants including threshold implants, graded channel implants, or any other punch through implants desired by the intended application may also be embedded into the base substrate 12. The resist, or mask 60 is then stripped off as illustrated in FIG. 7.

Figure 8:
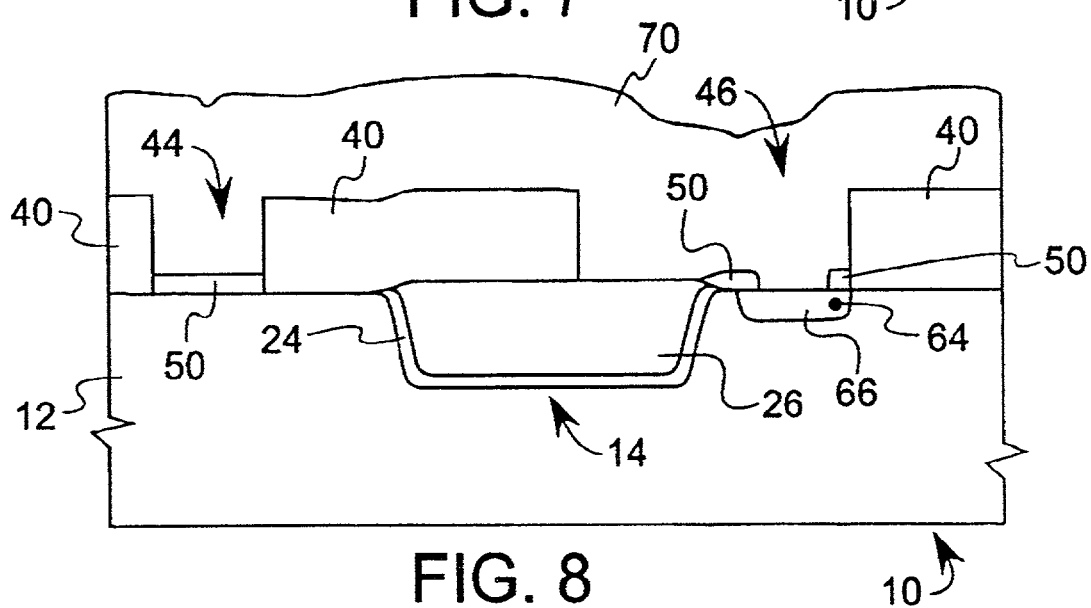
FIG. 8 is an illustration of a semiconductor structure during fabrication wherein a conductive layer is deposited over the semiconductor structure of FIG. 7 according to one embodiment of the present invention.

As illustrated in FIG. 8, a conductive layer 70 is deposited over the structure 10. The conductive layer 70 forms the gate conductor and local interconnect conductor. The conductive layer 70 comprises for example, a metal, alloy, metal-based material, polysilicon, or polysilicon based material.

Figure 9A:
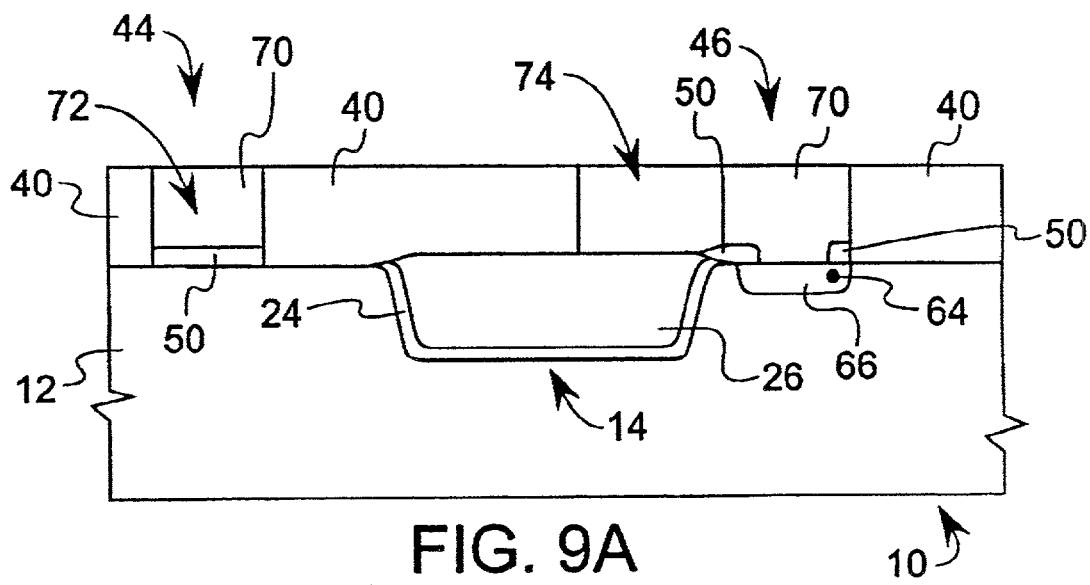
FIG. 9A is an illustration of a semiconductor structure during fabrication wherein the conductive layer of FIG. 8 is polished back so as to be substantially flush with the ILD layer according to one embodiment of the present invention.

As illustrated in FIG. 9A, the structure 10 is then planarized using CMP techniques for example. Subsequent to the planarizing process, that portion of the conductive layer 70 that filled the gate/local interconnect damascene trench 44 generally over the gate oxide layer 50 defines the gate conductor 72, and that portion of the conductive layer 70 that filled the gate/local interconnect damascene trench 46 generally over the plug area 66 defines a local interconnect conductor 74.

If the conductive layer 70 comprises a layer of polysilicon, a further doping operation is performed. For example, a conductive layer 70 comprising polysilicon is deposited using a CVD process to a thickness generally between 500 Angstroms and 3000 Angstroms. If it is desired to dope the polysilicon to an n-type, then a diffusion, ion implantation, or other process is performed to sufficiently dope the polysilicon with an n-type substance such as phosphorous. Likewise, if it is desirable to dope the polysilicon to a p-type, then a p-type material such as boron is implanted into the polysilicon. The polysilicon is then annealed.

Figure 9B:
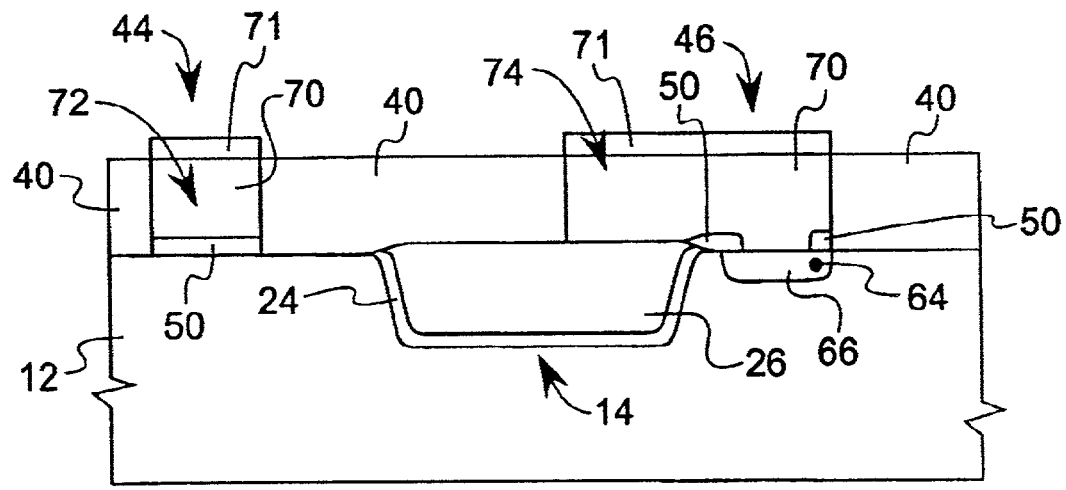
FIG. 9B is an illustration of a semiconductor structure during fabrication similar to that illustrated in FIG. 9A, wherein the damascene gate conductive material comprises polysilicon and the structure further includes an optional silicide layer formed over the damascene gate polysilicon according to one embodiment of the present invention.

Referring to FIG. 9B, if the conductive layer is a polysilicon, a silicide layer 71 is optionally formed. For example, if a silicide is desired over the damascene gate 90, a film, or transition material such as a Group VIA element (W or Mo for example), is deposited onto the polysilicon conductive layer 70. A subsequent anneal forms the silicide, and chemical etches remove the un-reacted, deposited film from the top of the ILD layer 40.

Figure 10:
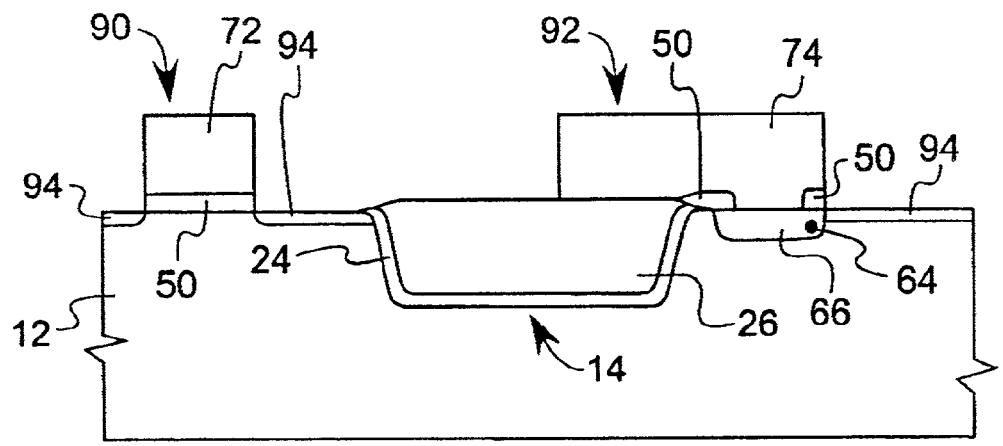
FIG. 10 is an illustration of a semiconductor structure during fabrication wherein the ILD layer of FIG. 9A is removed.

The ILD layer 40 is then stripped away, as illustrated in FIG. 10. An etch may be performed to remove the ILD layer 40 (not shown) leaving a damascene gate structure 90 and a local interconnect damascene structure 92.

At this point, any further doping that has not already been completed is performed. For example, it may be desirable to reduce channel resistance or increase speed parameters, thus an ion implant is used to form the optional lightly doped drain regions (LDD) 94.

Figure 11:
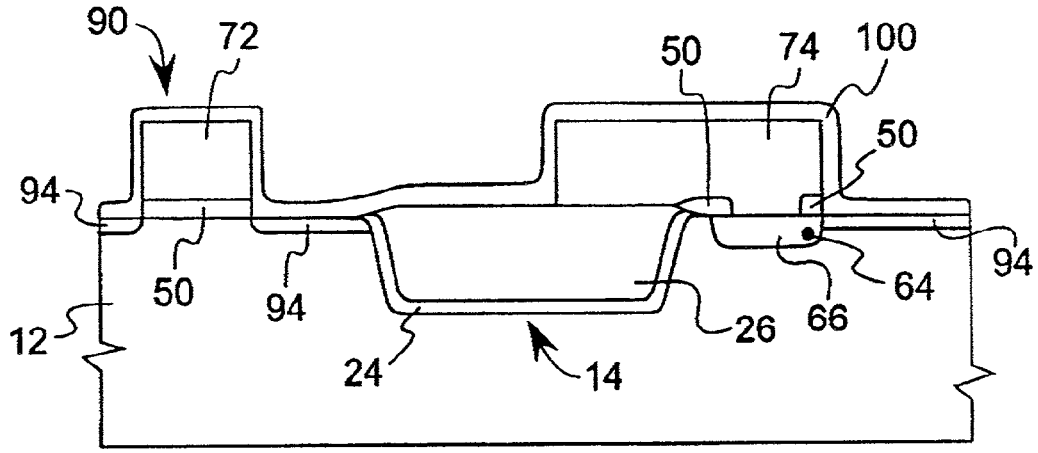
FIG. 11 is an illustration of a semiconductor structure during fabrication wherein a spacer layer is deposited over the damascene gate, local interconnect, and base substrate according to one embodiment of the present invention.
Figure 12A:
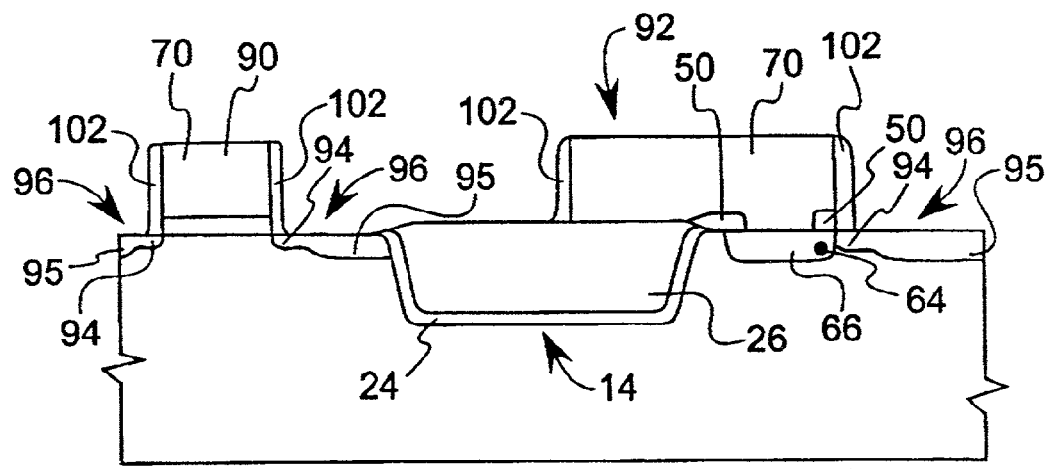
FIG. 12A is an illustration of a semiconductor structure during fabrication wherein spacers are formed on the damascene gate and local interconnect structures of FIG. 11 and subsequent source/drain implants are performed according to one embodiment of the present invention.

Referring to FIG. 11, a spacer layer 100 is deposited over the structure 10. As illustrated, the spacer layer 100 is generally conformal. The spacer layer 100 comprises for example, a layer of oxide or nitride deposited using CVD at a thickness generally between 500–1000 Angstroms. Referring to FIG. 12A, portions of the spacer layer 100 are removed to define spacers 102 against the vertical walls of the damascene gate structure 90 and the damascene local interconnect structure 92. The spacers 102 may have a rounded or curved edge by etching all horizontally disposed regions of the spacer layer 100 (not shown) such as by applying a directed reactive ion beam downwardly onto the substrate 12. Such a process is anisotropic and thus material is removed substantially vertically. It shall be appreciated that other anisotropic etch processing techniques may also be used.

After the etch is complete, a further ion implantation is performed to define the doped regions 95. The ion implant is at a higher concentration and energy than the previous implant, thus the doped regions 95 are illustrated as having a deeper penetration into the base substrate adjacent to the portion of the LDD regions 94 underneath the spacers 102. The LDD regions 94 and the doped regions 95 jointly define the doped source/drain regions 96. It will be appreciated that depending upon the intended application, one or both of the implant steps may be eliminated from the manufacturing steps. It will further be appreciated that the source/drain regions 96 may be implanted during other processing steps.

Figure 12B:
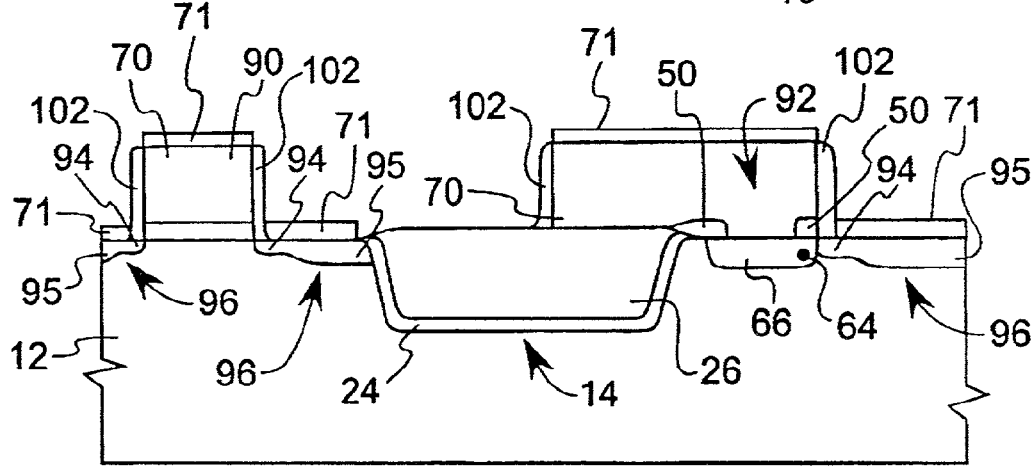
FIG. 12B illustrates the formation of optional silicide layers over the damascene gate and within the local interconnect according to one embodiment of the present invention.

Further, where the conductive layer comprises a polysilicon, an optional silicide layer may be desirable. Referring to FIG. 12B, after the formation of the spacers 102 and further doping is performed to define the doped source/drain regions 96, the silicide layer 71 is deposited over the structure 10. For example, after cobalt is deposited and a subsequent anneal process is performed, $CoSi_x$ is formed on the polysilicon conductive layer 70 and active areas, including the doped source/drain regions 96. The silicide layer 71 serves to lower the resistanco of the polysilicon conductive layer 70. Subsequent chemical etches remove the un-reacted film (cobalt) from the spacers 102 and other dielectrics.

Figure 13:
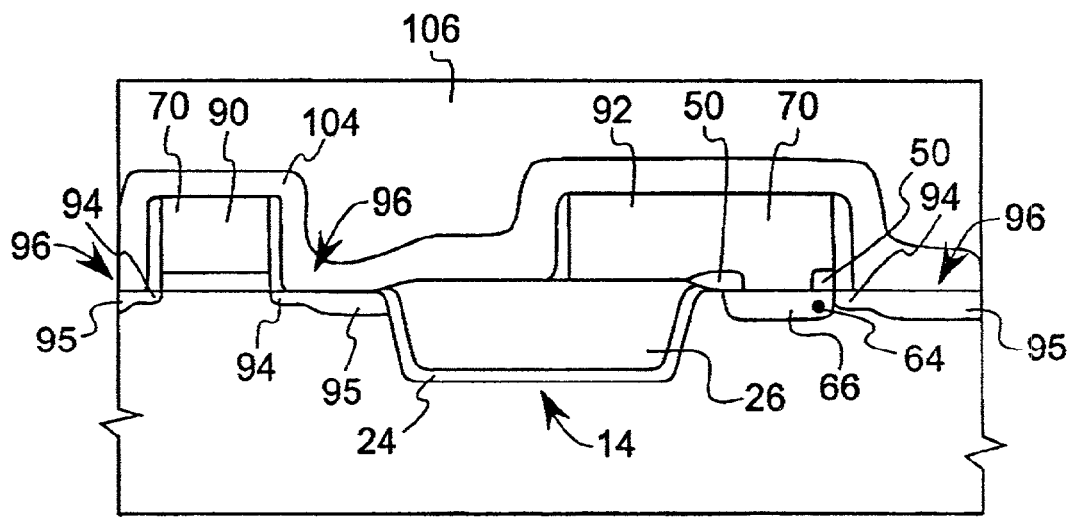
FIG. 13 is an illustration of a semiconductor structure during fabrication wherein dielectric layers are formed over the structure of FIG. 12A, according to one embodiment of the present invention.

Referring to FIG. 13, a dielectric layer 104 such as a conformal tetraethyloxysilicate (TEOS), oxide, or nitride layer is deposited over the structure 10. The dielectric layer 104 serves as a barrier layer for subsequent manufacturing processes. Further, a thick dielectric layer 106 is deposited over the dielectric layer 104. It shall be appreciated that additional processing steps may be performed to connect the damascene gate 90 and the local interconnect damascene 92 to additional layers of metallization. For example, the damascene gate 90 and/or the local interconnect damascene 92 may be connected to back end of line wiring (BEOL). The BEOL wiring completes the circuits designed within the integrated circuit device.

Figure 14:
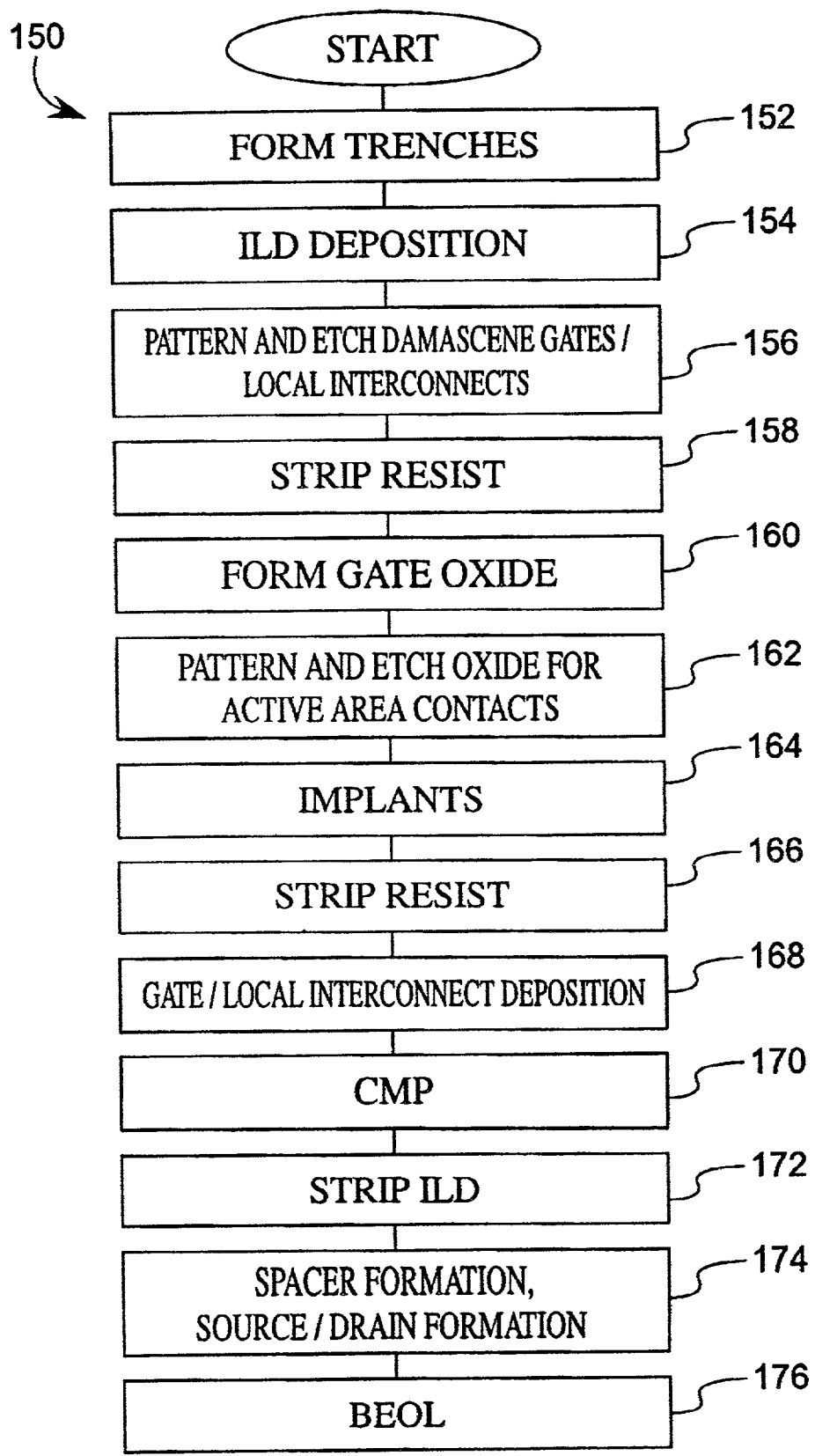
FIG. 14 is a flow chart illustrating the steps of manufacturing a damascene gate and local interconnect according to one embodiment of the present invention.

Referring to FIG. 14, a method of fabricating a semiconductor device according to one embodiment of the present invention is summarized. The method 150 comprises forming isolation trenches in the base substrate at block 152. An ILD layer is deposited over the base substrate at block 154, then a patterning and etching process is performed to define gate/local interconnect damascene trenches. Any residual resist material is then stripped at block 158. A layer of gate oxide is formed at least within the gate/local interconnect damascene trenches at areas where gates are to be formed at block 160. If oxide is formed on the base substrate in the areas that define local interconnects, a patterned oxide etch is performed to remove at least a portion of the oxide from the base substrate within the gate/local interconnect damascene trenches in the areas to define local interconnects at block 162. Any desired implants are deposited at block 164 and any residual resist is stripped at block 166. A conductive layer is then deposited forming the damascene gate and local interconnects within the gate/local interconnect damascene trenches at block 168. A polishing process is performed to polish back the conductive layer to the ILD layer at block 170. Next, the ILD layer is stripped at block 172 and any required doping is performed, such as LDD doping forming source and drain regions of active area, and further, spacers are formed adjacent to the gates and local interconnects at block 174. Finally, any required back end of line wiring is completed at block 176.

THE SRAM MEMORY CELL

Now described is an example of one of the numerous applications for the techniques and structures taught herein, and further demonstrates several key advantages of the present invention. The following discussion illustrates how the structures described with references to FIGS. 1–13 are used to implement a memory cell schematically illustrated in FIG. 15.

Figure 15:
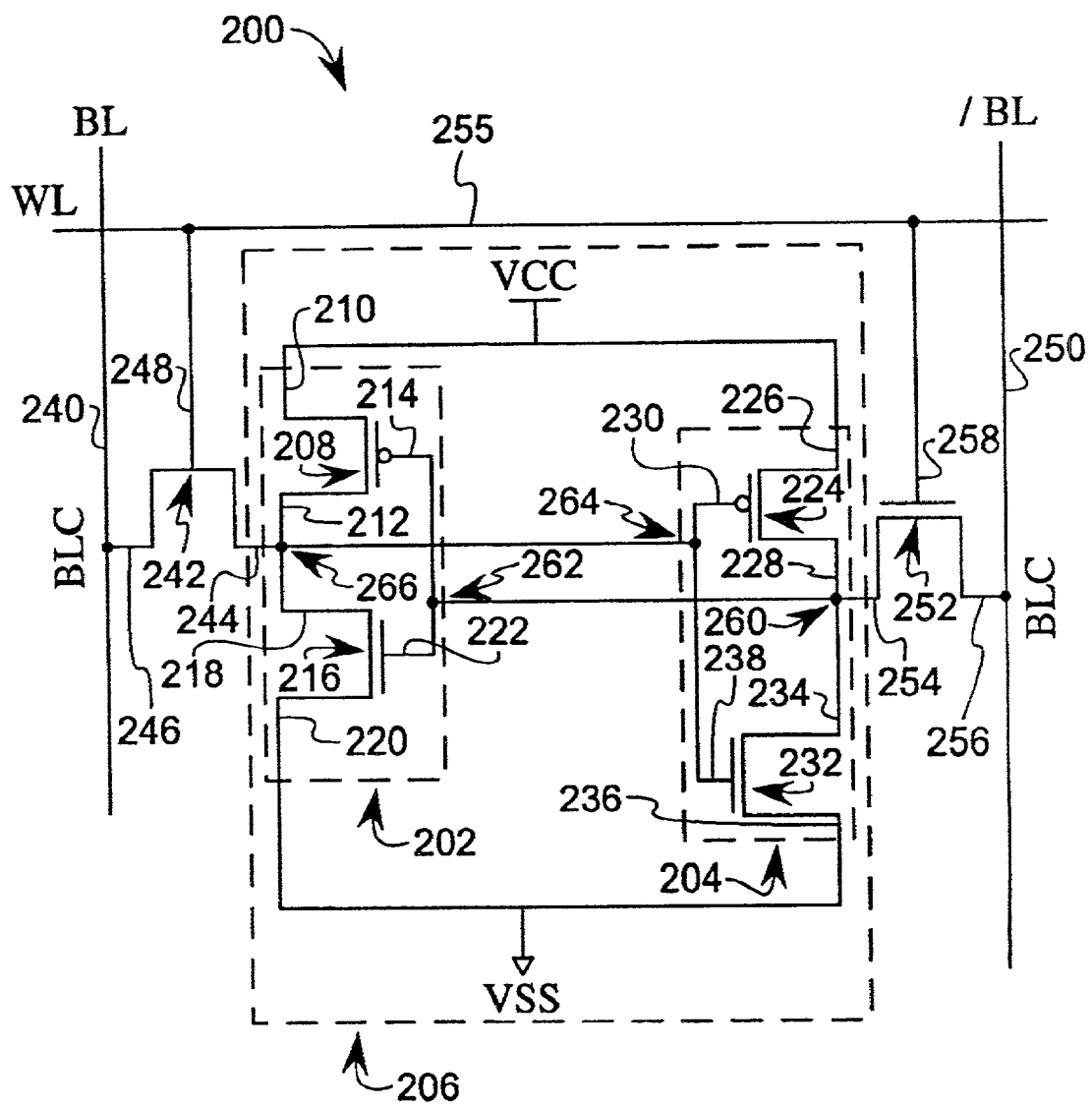
FIG. 15 is a schematic of an SRAM memory cell according to one embodiment of the present invention.
Figure 16:
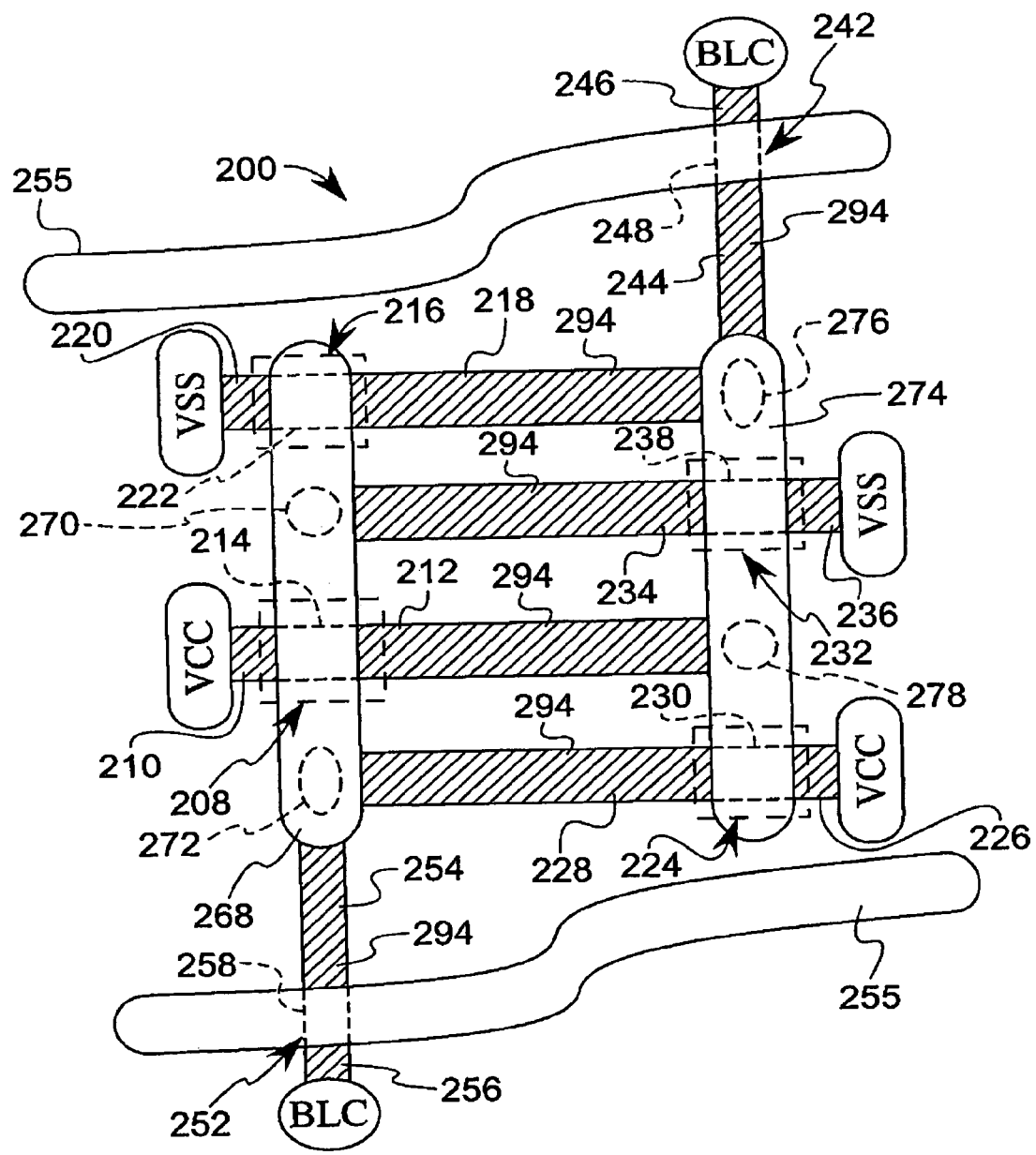
FIG. 16 is a layout of the SRAM memory cell according to one embodiment of the present invention; and, FIG. 17 is a block diagram of a computer system using an SRAM memory device according to one embodiment of the present invention.

FIG. 15 schematically illustrates a typical SRAM memory cell and FIG. 16 illustrates a layout for the SRAM memory cell of FIG. 15 constructed according to the techniques taught herein. As illustrated in FIG. 15, the SRAM memory cell 200 comprises a pair of inverters 202 and 204 that are cross-coupled to form a bi-stable flip-flop 206. The first inverter 202 comprises a first p-type transistor 208 having first and second source/drain regions 210, 212 and a gate 214, and a first n-type transistor 216 having first and second source/drain regions 218, 220 and a gate 222. The second inverter 204 comprises a second p-type transistor 224 having first and second source/drain regions 226, 228 and a gate 230, and a second n-type transistor 232 having first and second source/drain regions 234, 236 and a gate 238. The bi-stable flip-flop 206 is isolated from the bitline 240 by a first access transistor 242 having first and second source/drain regions 244, 246 and a gate 248.

Likewise, the bi-stable flip-flop 206 is isolated from a compliment bitline 250 by a second access transistor 252 having first and second source/drain regions 254, 256 and a gate 258. Both the first and second access transistors 242, 252 are controlled by a common wordline 255. The operation of SRAM memory is well known in the art and will not be discussed herein.

The schematic illustrated in FIG. 15 is presented to clarify the layout used to construct the SRAM memory cell according to techniques described in the present invention and illustrated in FIG. 16. It will be appreciated that FIG. 16 is not drawn to scale. Further certain proportions of FIG. 16 are exaggerated to facilitate an explanation of certain aspects of the present invention.

As illustrated in FIG. 16, the memory cell 200 comprises a first strip 268 and a second strip 274 coupled together by first, second, third, and fourth strips of active area 294. Everywhere the first and second strips 268, 274 cross the active area 294, either a transistor is formed (illustrated as a dashed box) or a contact is formed (illustrated as either a round or elliptical shape). The first and second strips 268, 274, and wordline 255 form conductive interconnects and may be fabricated as a damascene trenches as discussed with reference to FIGS. 1–13.

The gate 214 of the first p-type transistor and the gate 222 of the first n-type transistor 216 are constructed as part of first strip 268 by building damascene gate structures such as the damascene gate structure 90 illustrated in FIG. 13. Referring back to FIG. 16, the first contact 270 and the second contact 272 are constructed as part of the first strip 268 by building damascene local interconnect structures such as the damascene local interconnect structure 92 as illustrated in FIG. 13. Likewise, the second p-type transistor 224 and the second n-type transistor 232 are constructed as part of the second strip 274 by building damascene gate structures such as the damascene gate structure 90 illustrated in FIG. 13.

Referring back to FIG. 16, the third and fourth contacts 276 and 278 are constructed as part of the second strip 274 by building damascene local interconnect structures such as the damascene local interconnect structure 92 as illustrated in FIG. 13. The active areas 294 represent various dopings in the base substrate. For example, the active area 294 may comprise LDD regions 94 illustrated in FIG. 11, doping regions 95 illustrated in FIGS. 12A–13, the doped source/drain regions 96 illustrated in FIGS. 12A–13. Further, the active areas 294 may include implants such as the contact implants 64 illustrated in FIGS. 6–13. The contact implants 64 prevent the active area contact from shorting to the base substrate. The contact implants 64 further merge with the doped source/drain regions for device connection.

It will be observed that the common wordline 255 is schematically illustrated in FIG. 15 as a single continuous wordline. However, as illustrated in the layout of FIG. 16, the wordline 255 is actually two separate wordlines 255. By providing two separate wordlines that carry the same signal, fabrication symmetry is more easily achieved. This also allows the pull down transistors to be fabricated substantially identically and allows greater cell stability.

Referring now to FIG. 15, connection points 260 and 262 are connected together to cumulatively couple the first p-type transistor gate 214, the first n-type transistor gate 222, the source/drain region 228 of the second p-type semiconductor 224, the source/drain region 234 of the second n-type transistor 232, and the source/drain region 254 of the second access transistor 252. Likewise, connection points 264 and 266 are connected together to cumulatively couple the source/drain region 212 of the first p-type transistor 208, the source/drain region 218 of the first n-type transistor 216, the source/drain region 244 of the first access transistor 242, the gate 230 of the second p-type transistor 224, and the gate 238 of the second n-type transistor 232.

Referring back to FIG. 16, these connections are formed according one embodiment of the present invention using only the damascene trenches or first and second strips 268, 274 and active areas 294. The first p-type transistor gate 214 and the first n-type transistor gate 222 are formed in the first strip 268. The source/drain region 228 of the second p-type transistor 224 is coupled to the first strip 268 via the active area 294 and second contact 272. The source/drain region 234 of the second n-type transistor 232 is coupled to the first strip via the active area 294 and first contact 270. The source/drain region 254 of the second access transistor 252 is coupled to the first strip 268 via active area 294 to the second contact 272.

Likewise, the source/drain region 212 of the first p-type transistor 208 is coupled to the second strip 274 via active area 294 to the fourth contact 278. The source/drain region 218 of the first n-type transistor 216 is coupled to the second strip 274 via the active area 294 to the third contact 276. The source/drain region 244 of the first access transistor 242 is coupled to the second strip 274 via active area 294 to the third contact 276. The gate 230 of the second p-type transistor 224 and the gate 238 of the second n-type transistor 232 are formed in the second strip 274.

It will be appreciated that the second contact 272 must short the n-doped active area (source/drain region 254 of the second access transistor 258) to the p-doped active area (source/drain region 228 of the second p-type transistor 224). Likewise, the third contact 276 must short the n-doped active area (source/drain region 244 of the first access transistor 242) to the n-doped active area (source/drain region 218 of the first n-type transistor 216). Therefore, the second and third contacts 272, 276 are illustrated as an ellipse to differentiate them from the first and fourth contacts 270 and 278.

Figure 17:
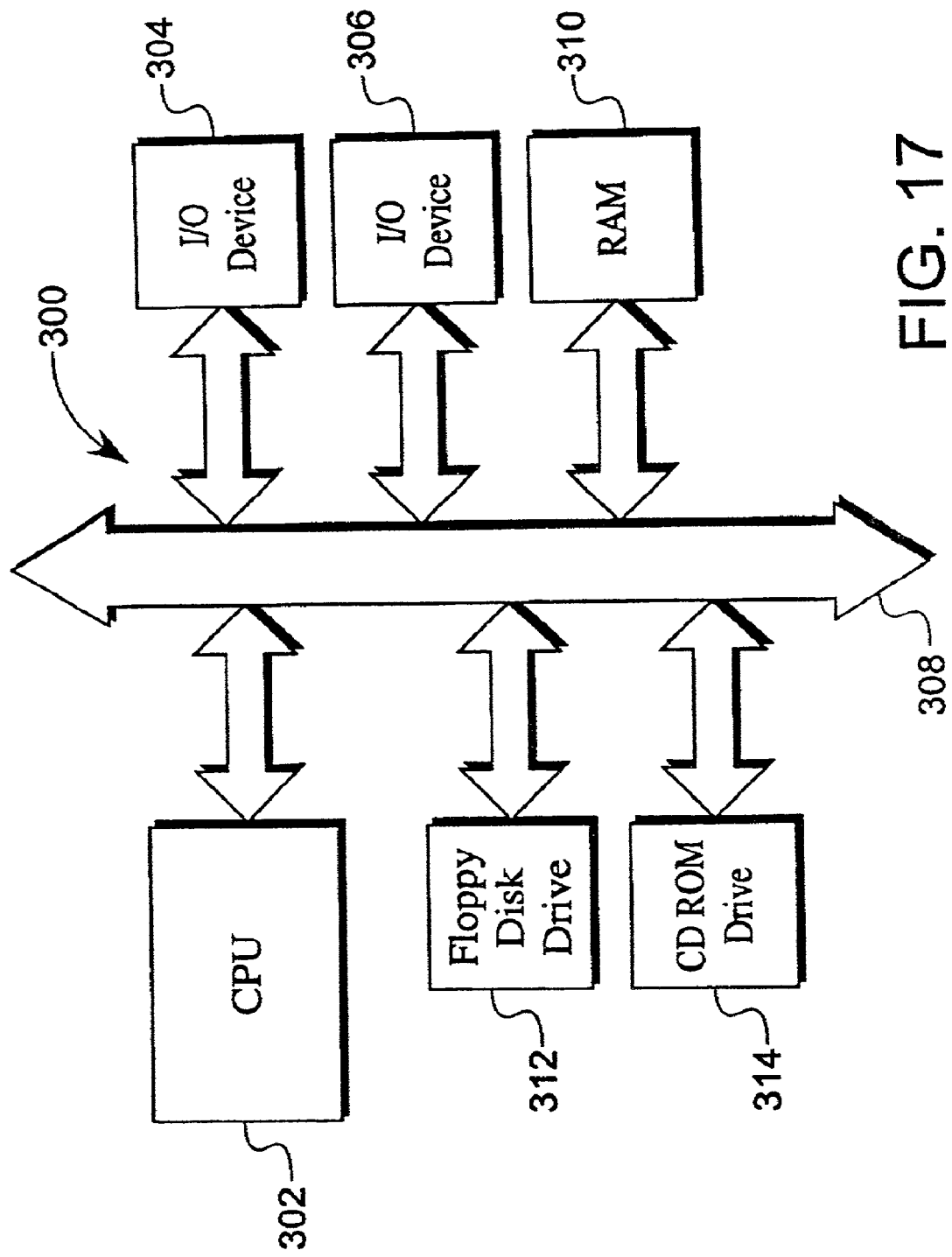

The memory cell illustrated with reference to FIGS. 15 and 16 can be used to construct memory devices suitable for use with general computer systems as illustrated in FIG. 17. A general computer system 300 comprises a microprocessor or central processing unit 302, that communicates with input/output (I/O) devices 304, 306 over a bus 308. It will be appreciated that any number of I/O devices can be used, and the selection of I/O devices will depend upon the application for which the computer system 300 is intended. The computer system 300 also includes random access memory (RAM) 310 and may include peripheral devices such as a floppy disk drive 312 and a compact disk (CD) ROM drive 314 which also communicate with CPU 302 over the bus 308.

The computer system 300 is exemplary of a digital device that includes memory devices. Other types of dedicated processing systems, including for example, radio systems, television systems, GPS receiver systems, telephones and telephone systems.

Utilizing the method of the present invention, the space occupied by the memory circuits, for example the RAM 310 can be reduced, thus reducing the size of the overall system. The reduced memory cell size of the memory cell 200 is realized by the layout of active area as described with reference to FIGS. 15 and 16, and the structure of the damascene trenches including gate and local interconnect described with reference to FIGS. 1–13. It must be noted that the exact architecture of the computer system 300 is not important and that any combination of computer compatible devices may be incorporated into the system.

Having described the invention in detail and by reference to preferred embodiments thereof, it will be apparent that modifications and variations are possible without departing from the scope of the invention defined in the appended claims.

What is claimed is:

1. A method of fabricating a semiconductor device comprising:

forming an isolation trench in a base substrate;

forming a first dielectric layer over said base substrate;

forming a first patterned mask over said first dielectric layer;

etching through said first dielectric layer to said base substrate in areas defined by said first patterned mask to define a damascene trench in said first dielectric layer, said damascene trench having a gate area and a local interconnect area and positioned such that at least a portion of said damascene trench at least partially overlies said isolation trench;

stripping said first patterned mask from said first dielectric layer;

growing an oxide layer on said base substrate, said oxide layer within said gate area of said damascene trench defining a gate oxide layer;

forming a second patterned mask over said semiconductor device, said second patterned mask arranged to expose at least a portion of said oxide layer within said local interconnect area;

etching away the exposed portion of said oxide layer within said damascene trench;

providing at least one contact implant within a plug area in said base substrate, wherein said plug area is located at least partially beneath and in contact with said damascene local interconnect structure;

stripping said second patterned mask from said semiconductor device;

depositing a conductive layer comprising a conductive material over said device such that said conductive material fills said damascene trench;

planarizing said conductive layer down to the surface of said dielectric layer;

removing said first dielectric layer to define a damascene gate structure and a damascene local interconnect structure;

forming lightly doped drain regions in said base substrate adjacent and lateral to said damascene gate structure and said damascene local interconnect structure;

depositing a spacer layer over said device;

anisotropically etching said spacer layer such that spacers are formed over the portions of said base substrate where said lightly doped drain regions are formed; and forming doped regions in said base substrate after formation of said spacers such that said base substrate is doped more deeply adjacent and lateral to said spacers and said lightly doped drain regions underneath said spacers, wherein said lightly doped drain regions and said doped regions define doped source/drain regions.

2. The method of fabricating a semiconductor device of claim 1, wherein said conductive material comprises a polysilicon material.

3. The method of fabricating a semiconductor device of claim 2, further comprising:

forming a silicide layer over said polysilicon material within said gate area of said damascene trench.

* * * * *

UNITED STATES PATENT AND TRADEMARK OFFICE
CERTIFICATE OF CORRECTION

PATENT NO. : 7,029,963 B2  
APPLICATION NO. : 09/943078  
DATED : April 18, 2006  
INVENTOR(S) : Todd R. Abbott Page 1 of 1

It is certified that error appears in the above-identified patent and that said Letters Patent is hereby corrected as shown below:

Col. 4, line 27 "the is isolation" should read --the isolation--;

Col. 7, line 38 "resistano" should read --resistance--; and

Col. 12, Claim 4 should be added as follows:

4. The method of fabricating a semiconductor device of claim 1, further comprising:

shaping said spacer layer to form spacers against the vertical walls of said damascene gate structure and said damascene interconnect structure.

Signed and Sealed this

Third Day of October, 2006

JON W. DUDAS  
*Director of the United States Patent and Trademark Office*